United States Patent [19]
Yabe et al.

[11] Patent Number: 5,659,507
[45] Date of Patent: Aug. 19, 1997

[54] CLOCK SYNCHRONOUS TYPE DRAM WITH DATA LATCH

[75] Inventors: Tomoaki Yabe, Kawasaki; Kenji Numata, Yamato; Katsuhiko Sato, Yokohama; Ryo Haga, Yokohama; Shinji Miyano, Yokohama, all of Japan; Tohru Furuyama, South Burlington, Vt.

[73] Assignee: Kabushiki Kaisha Toshiba, Kawasaki, Japan

[21] Appl. No.: 753,432

[22] Filed: Nov. 25, 1996

Related U.S. Application Data

[62] Division of Ser. No. 508,080, Jul. 27, 1995, abandoned.

[30] Foreign Application Priority Data

Jul. 28, 1994 [JP] Japan ................................. 6-176989

[51] Int. Cl.$^6$ .................................................. G11C 7/00
[52] U.S. Cl. .................. 365/189.01; 365/219; 365/220; 365/221
[58] Field of Search ........................... 365/189.01, 219, 365/220, 221, 189.05

[56] References Cited

U.S. PATENT DOCUMENTS

| | | | |
|---|---|---|---|
| 4,807,189 | 2/1989 | Pinkham et al. | 365/220 |
| 5,327,386 | 7/1994 | Fudeyasu | 365/189.05 |
| 5,361,236 | 11/1994 | Iwakiri | 365/221 |
| 5,367,486 | 11/1994 | Mori et al. | 365/221 |

FOREIGN PATENT DOCUMENTS

| | | |
|---|---|---|
| 2-29987 | 1/1990 | Japan . |
| 2-226581 | 9/1990 | Japan . |

OTHER PUBLICATIONS

IEEE Journal of Solid–State Circuits, vol. 26, No. 4, Apr. 1991, pp. 479–482, N. Kushiyama et al., "A 12–MHz Data Cycle 4–Mb DRAM with Pipeline Operation".

IEICE Trans. Electron, vol. E77–C, No. 8, Aug. 1994, pp. 1303–1315, S. Ohshima et al., "High Speed DRAMs with Innovative Architectures".

*Primary Examiner*—David C. Nelms
*Assistant Examiner*—Vu A. Le
*Attorney, Agent, or Firm*—Banner & Witcoff, Ltd.

[57] ABSTRACT

A semiconductor memory device includes a memory cell array, row decoder, bit line pairs, sense amplifier, sense amplifier control circuit, data latch, transfer gate, transfer gate control circuit, and write circuit. The memory cell array has dynamic memory cells arranged in an array form. The row decoder decodes a row address signal to select a desired one of rows of the memory cell array. Each of the bit line pairs is connected to those of the memory cells which are arranged on a corresponding one of columns of the memory cell array. The sense amplifier amplifies data read out on the paired bit lines and positively feeding data back to the paired bit lines to hold the data. The sense amplifier control circuit controls the operation of the sense amplifier. The data latch latches readout data and write data. The transfer gate transfers data between the data latch and the sense amplifier. The transfer gate control circuit controls the transfer gate. The write circuit writes data into the data latch in synchronism with a clock signal. At the time of writing data into the memory cells, data is previously supplied to the data latch by the write circuit and latched in the data latch, and after the transfer gate control circuit controls the transfer gate to supply data to the bit line pairs from the data latch, the sense amplifier control circuit activates the sense amplifier.

21 Claims, 11 Drawing Sheets

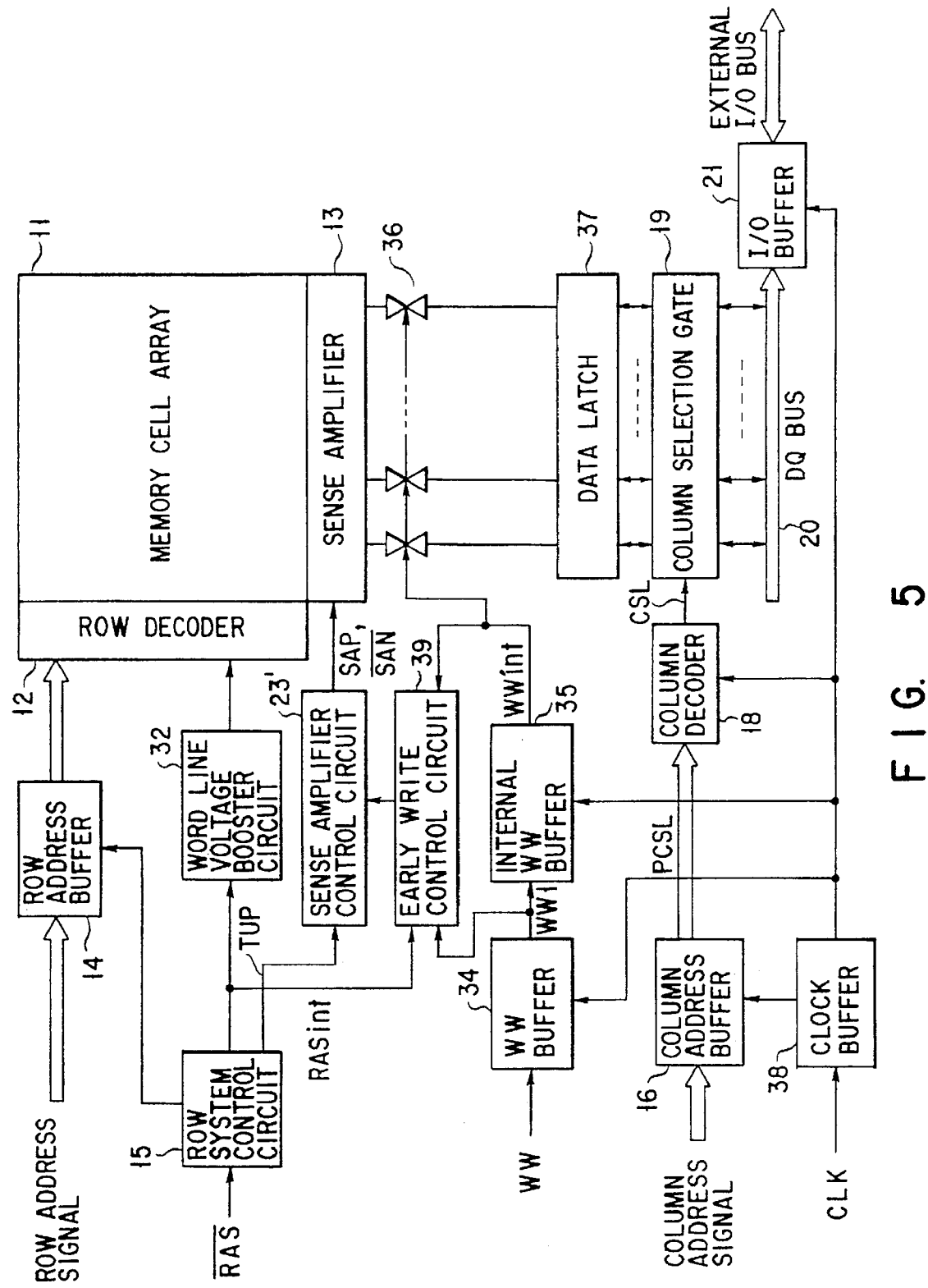
F I G. 5

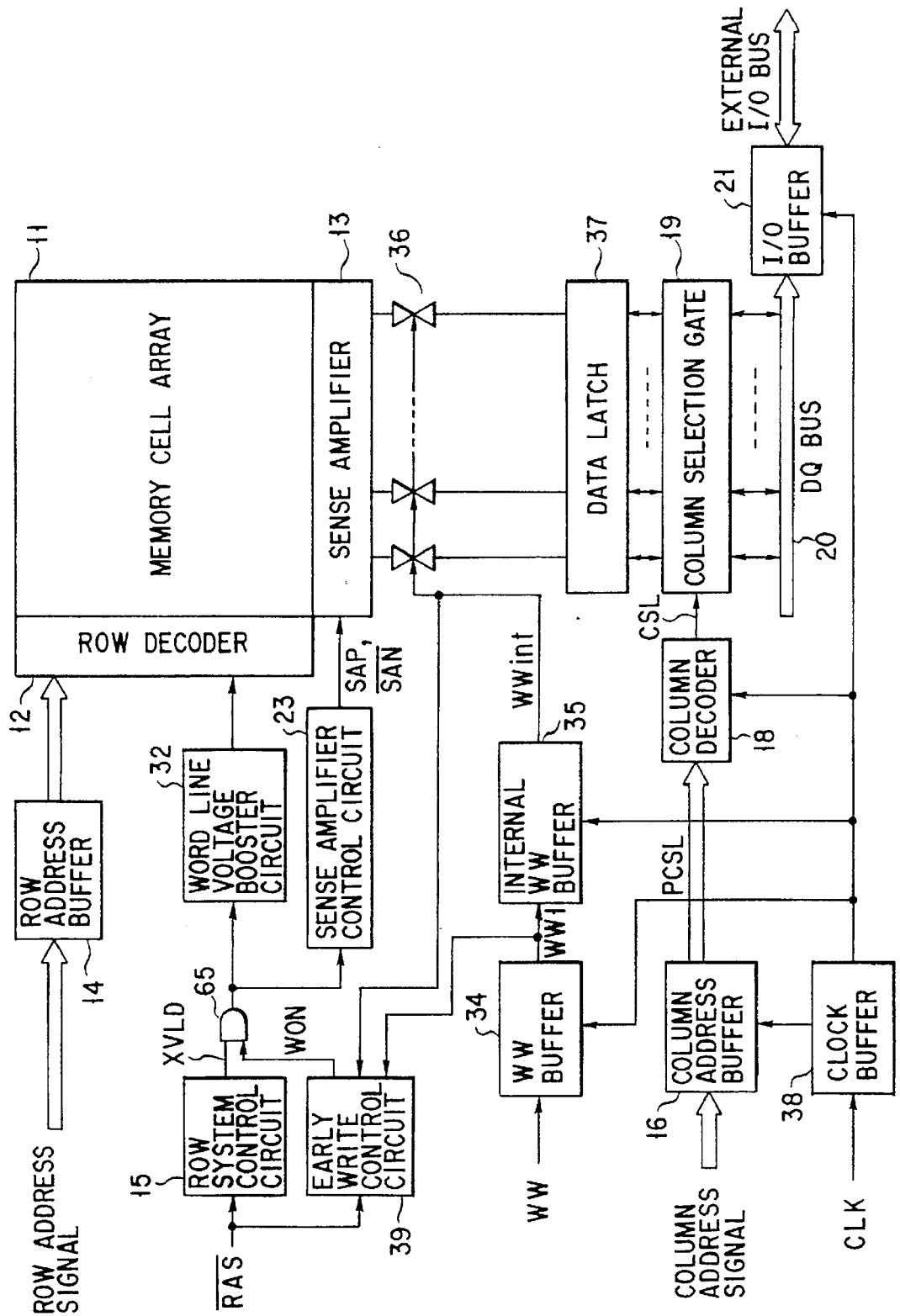
F I G. 10

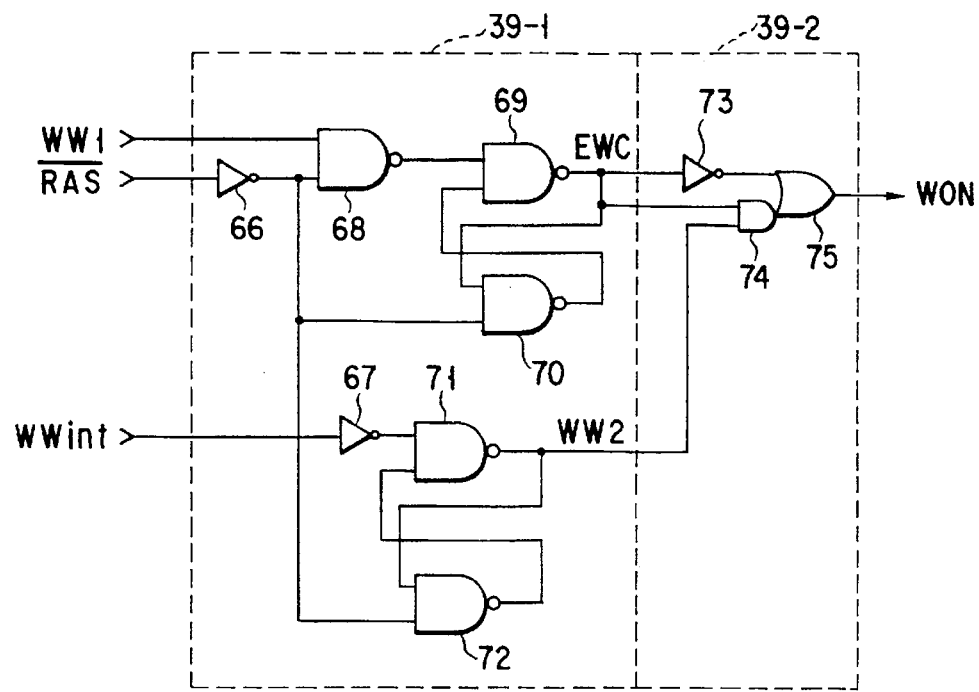
F I G. 11
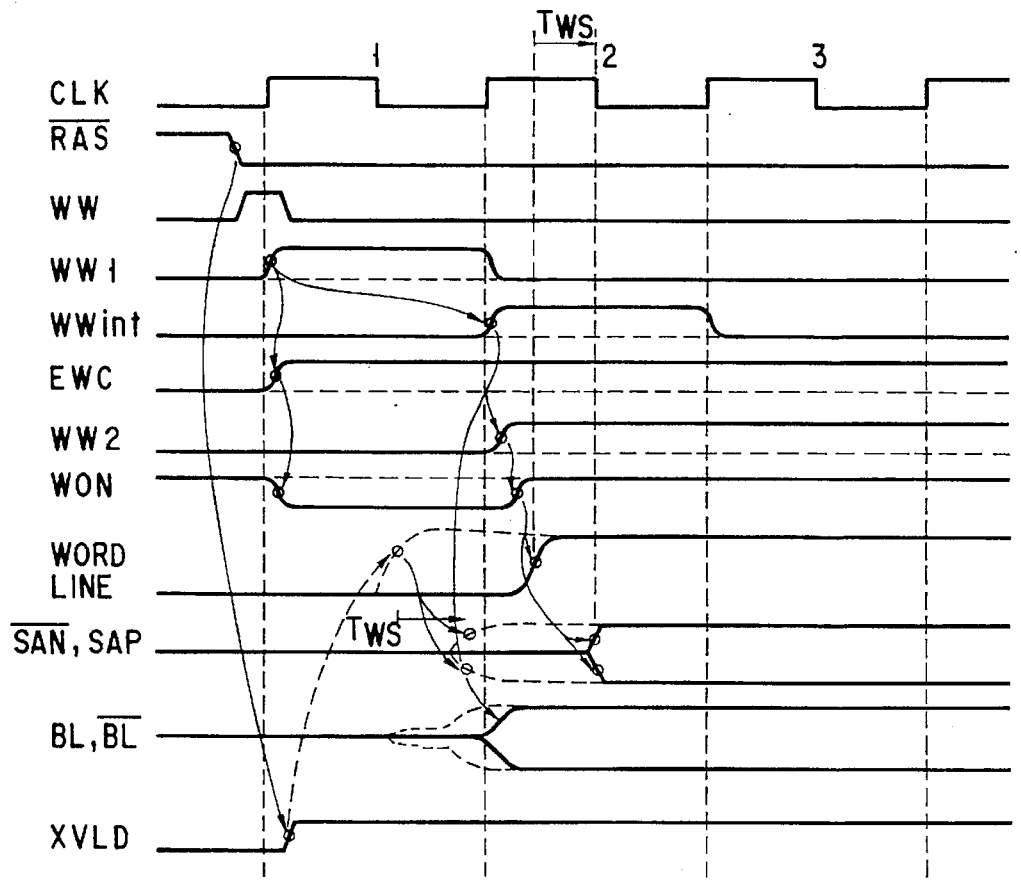
F I G. 12

CLOCK SYNCHRONOUS TYPE DRAM WITH DATA LATCH

This application is a division of application Ser. No. 08/508,080, filed Jul. 27, 1995 abandoned.

BACKGROUND OF THE INVENTION 1. Field of the Invention

This invention relates to a semiconductor memory device and more particularly to a clock synchronous type dynamic random access memory (DRAM) with data latch.

2. Description of the Related Art

The structure and operation of a general DRAM are described in IEEE JOURNAL OF SOLID-STATE CIRCUITS, VOL. 26, NO. 4, APRIL 1991 pp. 479–482 N. Kushiyama et al., "A 12-MHz Data Cycle 4-Mb DRAM with Pipeline Operation", for example.

However, in the conventional DRAM, since it is necessary to invert the output state of a sense amplifier at the time of data writing in a case where data stored in the memory cell and data input from the exterior are different from each other, the writing operation speed is lowered. That is, when an address signal is input from the exterior, the potential of a word line designated by the row address signal is first set to a high level irrespective of the writing operation or readout operation and data of a memory cell corresponding to the word line is read out to the sense amplifier and latched therein. In this case, if the memory system is set in the writing mode, data input from the exterior is written into the sense amplifier by turning ON a column selecting transistor connected between the sense amplifier and the I/O buffer. At this time, if data read out from the memory cell and data input from the exterior are different from each other, it becomes necessary to invert the output state of the sense amplifier and invert the potential relation of paired bit lines, thereby making the writing time long.

The technique of transferring data to the bit lines before the sense amplifier is activated at the time of writing, the operation of setting the paired bit lines to potentials corresponding to the write data when variations in the potential levels of the paired bit lines are still small and amplifying the potential difference by use of the sense amplifier is described in Jpn. Pat. Appln. KOKAI Publication No. 2-226581 and Jpn. Pat. Appln. KOKAI Publication No. 2-29987. According to this technique, time for inverting the output state of the sense amplifier becomes unnecessary and the writing operation speed is enhanced.

It is strongly required to enhance the data writing speed and reading speed in the DRAM, and in order to meet the requirement, a clock synchronous type device in which data is written or read out in synchronism with a clock signal is used. The clock synchronous type semiconductor memory device is described in IEICE TRANS. ELECTRON, VOL. E77-C, NO. 8 AUGUST 1994 pp. 1303–1315 S. Ohshima et al., "High Speed DRAMs with Innovative Architectures, for example. Further, it takes a longer time when different rows are successively accessed than when the same rows are successively accessed, but in order to prevent the user from noticing the delay in the access, a structure with a data latch is used. In order to use the clock synchronous type structure with data latch, it is necessary to effect the data transfer between the sense amplifier and the data latch in synchronism with the clock signal.

With the above clock synchronous type DRAM with data latch, the current driving ability of the sense amplifier must be larger than the current driving ability of the data latch in order to make it possible to effect the data transfer from the sense amplifier to the data latch (at the time of reading). With the above relation of the current driving ability, an output of the sense amplifier cannot be inverted by an output of the data latch if the timing of activation of the sense amplifier does not match with the data transfer timing at the time of data transfer from the data latch to the sense amplifier (at the time of writing), and there occurs a possibility of writing error. However, in this type of conventional DRAM, the sense amplifier activates the internal timer at the time of fall of the $\overline{\text{RAS}}$ signal and this operation is not synchronized with the clock signal. On the other hand, since the data transfer is effected in synchronism with the clock signal, it is difficult to attain the matching between the above timings.

SUMMARY OF THE INVENTION

Accordingly, an object of this invention is to provide a clock synchronous type DRAM with data latch in which a large operation margin can be attained.

Another object of this invention is to provide a clock synchronous type DRAM with data latch in which the timing of data transfer between the sense amplifier and the data latch can be adequately adjusted by use of a clock signal with wide frequency range.

The above object can be attained by a semiconductor memory device comprising a memory cell array having a plurality of dynamic memory cells arranged in an array form; a row decoder for selecting a desired row in the memory cell array; bit lines each connected to those of the memory cells which are arranged on a corresponding column of the memory cell array; a sense amplifier for amplifying data read out on the bit line and positively feeding the data back to the bit line to hold the data; a sense amplifier control circuit for controlling the operation of the sense amplifier; a data holding circuit for holding readout data and writing data; a transfer gate section for transferring data between the data holding circuit and the sense amplifier; a transfer gate control circuit for controlling the transfer gate section; and a writing circuit for writing data into the data holding circuit in synchronism with a clock signal; wherein, at the time of data writing into the memory cell array, the writing circuit previously supplies data to the data-holding circuit to hold the data therein, the transfer gate control circuit controls the transfer gate section to cause the data holding circuit to supply the data to the bit line, and then, the sense amplifier control circuit activates the sense amplifier.

With the above construction, since the sense amplifier is activated by the sense amplifier control circuit after data is transferred from the data latch to the sense amplifier, the operation margin can be enlarged and the timing of data transfer between the sense amplifier and the data latch can be adequately set in a wide frequency range of the clock signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 5 is a block diagram showing the schematic construction of a clock synchronous type DRAM with data latch which is improved over the first embodiment and which can be operated in a wide clock frequency range, for illustrating a semiconductor memory device according to a second embodiment of this invention;

FIG. 10 is a block diagram showing the schematic construction of still another clock synchronous type DRAM with data latch which can be operated in a wide clock frequency range, for illustrating a semiconductor memory device according to a fourth embodiment of this invention;

FIG. 11 is a circuit diagram showing an example of the detailed construction of an Early Write control circuit shown in FIG. 10; and FIG. 12 is a timing chart for illustrating the operation of circuit shown in FIGS. 10 and 11.

DETAILED DESCRIPTION OF THE PREFERRED EMBODIMENTS

Figure 1:
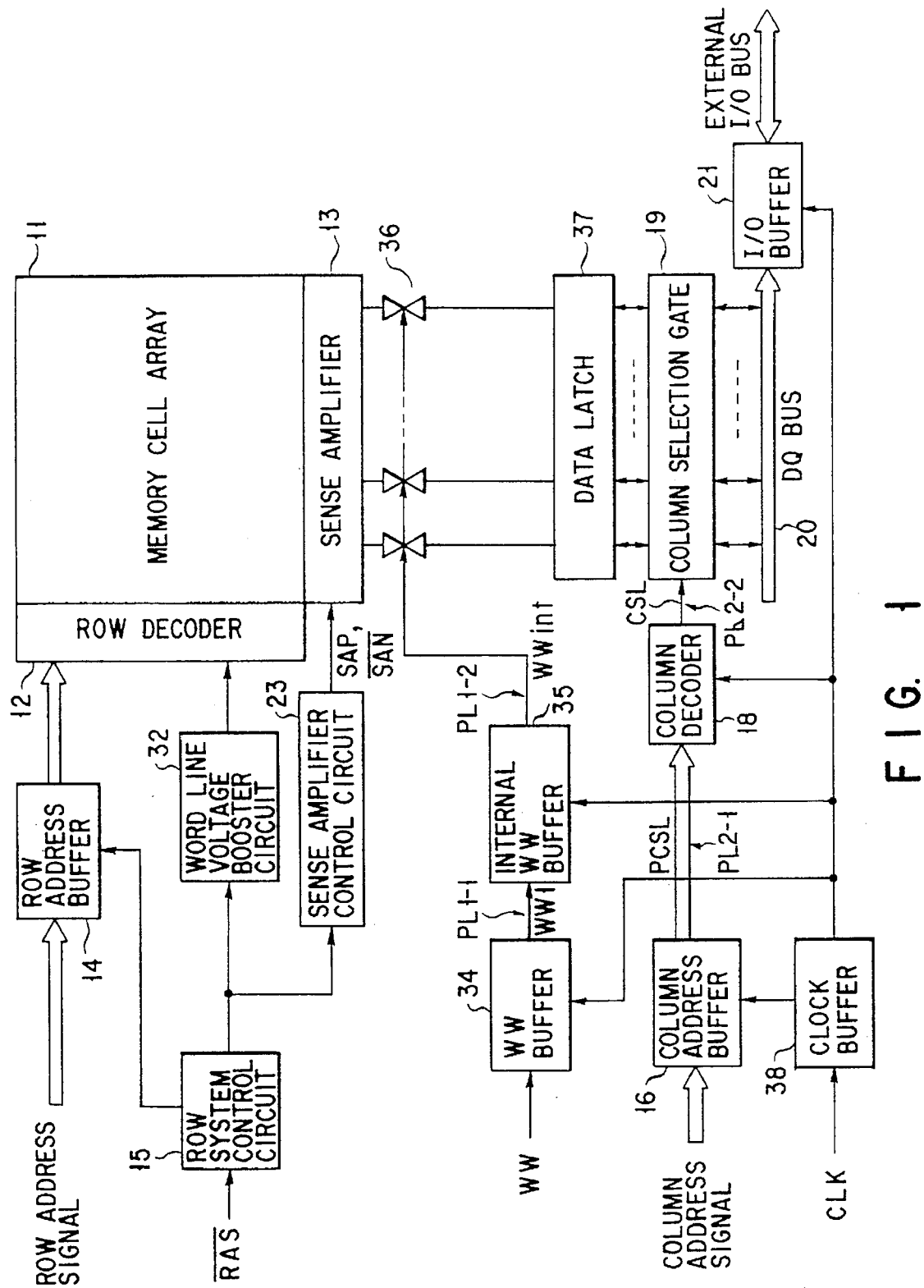
FIG. 1 is a block diagram showing the schematic construction of a clock synchronous type DRAM with data latch, for illustrating a semiconductor memory device according to a first embodiment of this invention.

FIG. 1 is a block diagram showing the schematic construction of a clock synchronous type DRAM with data latch, for illustrating a semiconductor memory device according to a first embodiment of this invention. A memory cell array (DRAM cell array) 11 has memory cells arranged in an array form. A row decoder 12 selects a desired one row of the memory cells in the memory cell array 11. A sense amplifier 13 amplifies data read out from one of the memory cells of the memory cell array 11 or data to be written into the memory cell. A row address buffer 14 temporarily stores an input address signal and supplies the address signal to the row decoder 12. A row system control circuit 15 controls the whole circuit of row system in response to a $\overline{RAS}$ signal. A column address buffer 16 temporarily stores an input address signal and supplies the address signal to a column decoder 18. The column decoder 18 controls a column selection gate 19 to select one column of the memory cells in the memory cell array 11. The column selection gate 19 transfers readout data of a column selected by the column decoder 18 to a DQ bus 20 or supplies write data on the DQ bus 20 to a data latch 37. An I/O buffer 21 temporarily stores data read out from the memory cell array 11 and outputs the data to an external I/O bus, or temporarily stores data to be written into the memory cell array 11 from the external bus I/O bus. A word line voltage booster circuit 32 is controlled by the row system control circuit 15 and supplies a boosted voltage for boosting the potential of the word line to the row decoder 12. A sense amplifier control circuit 23 is controlled by the row system control circuit 15 to supply sense amplifier activation signals SAP, $\overline{SAN}$ so as to control the operation of the sense amplifier. A WW buffer 34 is supplied with a transfer gate activation signal WW and supplies a signal WW to an internal WW buffer 35. A transfer gate section 36 is connected between the data latch 37 and the sense amplifier 13 and controlled by an internal transfer gate activation signal WWint output from the WW buffer 35. A clock buffer 38 is supplied with a clock signal CLK to control the column address buffer 16, column decoder 18, I/O buffer 21, WW buffer 34 and internal WW buffer 35.

If the memory cell array 11 has an array of m rows and n columns, the data latch includes n data latch units, that is, data latch units of a number for storing data of one row. The data latch 37 has a construction similar to that of a cache DRAM whose cache section functions as a data latch of one row and n columns.

Next, the schematic operation of the DRAM shown in FIG. 1 is explained.

A row address signal is supplied to the row address buffer 14. The row address buffer 14 fetches the row address signal according to the control of the row system control circuit 15 and supplies the same to the row decoder 12. A desired one row of the memory cell array 11 is selected by the row decoder 12. The row system control circuit 15 is supplied with a $\overline{RAS}$ signal and supplies an output signal to the word line voltage booster circuit 32 and sense amplifier control circuit 23. An output of the word line voltage booster circuit 32 is supplied to the row decoder 12. The sense amplifier activation signals SAP, $\overline{SAN}$ output from the sense amplifier control circuit 23 are supplied to the sense amplifier 13. The WW buffer 34 is supplied with a transfer gate activation signal WW and supplies a signal WW1 to the internal WW buffer 35 in response to an output signal of the clock buffer 38. The internal WW buffer 35 supplies an internal transfer gate activation signal WWint to the transfer gate section 36 in response to an output signal of the clock buffer 38 to control whether or not readout data output from the sense amplifier 13 should be transferred to the data latch 37 or whether or not write data latched in the data latch 37 should be transferred to the sense amplifier 13.

On the other hand, a column address signal is supplied to the column address buffer 16. The column address buffer 16 fetches a column address signal in response to an output signal of the clock buffer 38 and supplies a signal PCSL to the column decoder 18. The column decoder 18 decodes the signal PCSL and outputs a column selection signal CSL in response to an output signal of the clock buffer 38 to control the column selection gate 19. As a result, data of a selected column among data latched in the data latch 37 is output to the external I/O bus via the DQ bus 20 and I/O buffer 21. Alternatively, data on the external I/O bus is supplied to the data latch 37 via the I/O buffer 21, DQ bus 20 and column selection gate 19. A clock signal CLK is supplied to the clock buffer 38 and the column address buffer 16, WW buffer 34, internal WW buffer 35, column decoder 18 and I/O buffer 21 are operated in synchronism with the clock signal CLK.

In the circuit of FIG. 1, a signal transmission path (WW buffer 34→internal WW buffer 35→transfer gate 36) of the transfer gate activation signal WW for turning ON/OFF the transfer gate 36 and a signal transmission path (column address buffer 16→column decoder 18→column selection gate 19) of the column address signal are divided into two pipeline stages (pipeline first stage PL1-1, PL2-1, pipeline second stage PL1-2, PL2-2) and the signals propagate along the pipeline stages PL1-1, PL2-1 and PL1-2, PL2-2 in synchronism with the clock signal CLK one stage for each clock cycle. By use of the pipeline technique, the memory can be operated in synchronism with a high-frequency clock.

Figure 2:
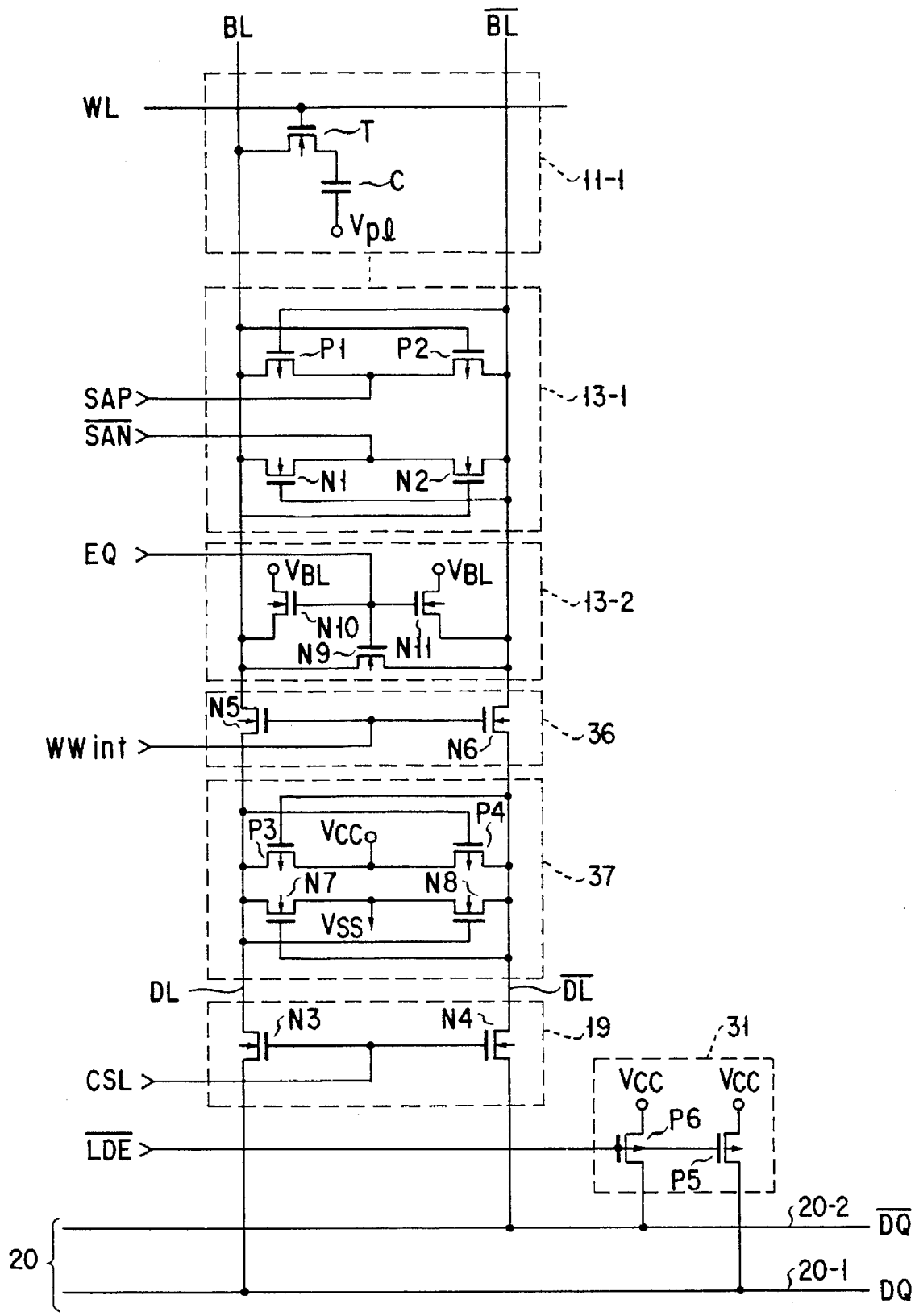
FIG. 2 is a circuit diagram showing the detail construction of a memory cell, sense amplifier, transfer gate, data latch, column selection gate and DQ bus in the circuit of FIG. 1 with much attention put on a pair of bit lines.

FIG. 2 shows an example of the detailed construction of the memory cell array 11, sense amplifier 13, transfer gate 36, data latch 37 and column selection gate 19 in the circuit of FIG. 1 with much attention put on one pair of bit lines BL, $\overline{BL}$. The gate of a transfer MOS transistor T in the memory cell 11-1 is connected to a word line WL, and the drain thereof is connected to the bit line BL. A data holding capacitor C is connected between the source of the MOS transistor T and a reference potential supplying source Vpl.

The sense amplifier 13 includes a first circuit section 13-1 for amplifying and holding a potential difference between the paired bit lines and a second circuit section 13-2 for equalizing the potentials of the paired bit lines. The first circuit section 13-1 has a latch structure for amplifying data read out on the paired bit lines BL, $\overline{BL}$ and positively feeding the data back to the bit lines BL, $\overline{BL}$ to hold the data. The first circuit section 13-1 is constructed by P-channel MOS transistors P1, P2 and N-channel MOS transistors N1, N2. The current paths of the P-channel MOS transistors P1, P2 are series-connected between the bit lines BL and $\overline{BL}$, the gate of the MOS transistor P1 is connected to the bit line $\overline{BL}$, and the gate of the MOS transistor P2 is connected to the bit line BL. Likewise, the current paths of the N-channel MOS transistors N1, N2 are series-connected between the bit lines BL and $\overline{BL}$, the gate of the MOS transistor N1 is connected to the bit line $\overline{BL}$, and the gate of the MOS transistor N2 is connected to the bit line BL. A sense amplifier activation signal SAP output from the sense amplifier control circuit 23 is supplied to a connection node between the MOS transistors P1 and P2 and a sense amplifier activation signal $\overline{SAN}$ output from the sense amplifier control circuit 23 is supplied to a connection node between the MOS transistors N1 and N2.

The second circuit section (bit line equalizer) 13-2 includes N-channel MOS transistors N9 to N11 which are ON/OFF-controlled by an equalizing signal EQ. The current path of the MOS transistor N9 is connected between the bit lines BL and $\overline{BL}$. The current path of the MOS transistor N10 is connected between the bit line BL and an equalizing potential $V_{BL}$, and the current path of the MOS transistor N11 is connected between the bit line $\overline{BL}$ and the equalizing potential $V_{BL}$. The bit lines BL, $\overline{BL}$ are set to the potential $V_{BL}$ (approx. Vcc/2) when the equalizing signal EQ is set to the "H" level.

One end of the current path of the MOS transistor N5 among the N-channel MOS transistors N5 and N6 constructing the transfer gate 36 is connected to the bit line BL, and one end of the current path of the MOS transistor N6 is connected to the bit line $\overline{BL}$. An internal transfer gate activation signal WWint output from the internal WW buffer 35 is supplied to the gates of the MOS transistors N5, N6. The other end of the current path of the MOS transistor N5 is connected to a data line DL, and the other end of the current path of the MOS transistor N6 is connected to a data line $\overline{DL}$.

The paired data lines DL, $\overline{DL}$ are connected to the data latch 37. The data latch 37 is constructed by P-channel MOS transistors P3, P4 and N-channel MOS transistors N7, N8. The source of the MOS transistor P3 is connected to the power supply Vcc, the drain thereof is connected to the data line DL, and the gate thereof is connected to the data line $\overline{DL}$. The source of the MOS transistor P4 is connected to the power supply Vcc, the drain thereof is connected to the data line $\overline{DL}$, and the gate thereof is connected to the data line DL. Further, the source of the MOS transistor N7 is connected to the ground line Vss, the drain thereof is connected to the data line $\overline{DL}$, and the gate thereof is connected to the data line $\overline{DL}$. The source of the MOS transistor N8 is connected to the ground line Vss, the drain thereof is connected to the data line $\overline{DL}$, and the gate thereof is connected to the data line DL.

To transfer (or read) data inverse to the data held in the data latch 37 from the sense amplifier 13-1 through the transfer gate 36, the data latch 37 must be inverted by virtue of the driving ability of the sense amplifier 13-1. It is therefore required that the data latch 37 have less current-driving ability less than the sense amplifier 13-1. To fulfill this requirement, the MOS transistors P3, P4, N7 and N8, all incorporated in the latch 37, have a small size.

A column selection gate 19 is connected between the transfer gate 36 and the DQ bus 20. The column selection gate 19 is constructed by column selection transistors N3, N4 of N channel type. The current path of the column selection transistor N3 is connected between the data line $\overline{DL}$ and the DQ bus 20-1, and the current path of the column selection transistor N4 is connected between the data line DL and the DQ bus 20-2. A column selection signal CSL output from the column decoder 18 is supplied to the gates of the column selection transistors N3, N4 to control the ON/OFF states of the column selection transistors.

A precharge circuit 31 for precharging the DQ buses 20-1, 20-2 is connected to the DQ buses. The precharge circuit 31 is constructed by P-channel MOS transistors P5, P6 which are ON/OFF controlled by a signal $\overline{LDE}$. The current path of the MOS transistor P5 is connected between the DQ bus 20-1 and the power supply Vcc, and the current path of the MOS transistor P6 is connected between the DQ bus 20-2 and the power supply vcc.

Next, the writing operation which is the feature of the first embodiment is explained in detail. The writing operation in the clock synchronous type DRAM with data latch is effected in two-stage operations. The first-stage operation is to write data on the external I/O bus into the data latch 37 via the I/O buffer 21, DQ bus 20 and column selection gate 19. The second-stage operation is to simultaneously transfer data written in the data latch 37 to the sense amplifier 13 via the transfer gate section 36. In this case, during the first-stage operation, the transfer gate section 36 is closed and the data latch 37 and the memory cell array 11 can be independently operated. As a result, if the row selecting operation of the memory cell 11 into which data is written can be effected in the second-stage operation while the first-stage operation is being effected, and then, data is simultaneously transferred to a selected row by turning ON the transfer gate section 36 in one clock cycle, time for the row selecting operation (which normally takes tens of nano-seconds) of the memory cell array 11 can be apparently disregarded.

Figure 3:
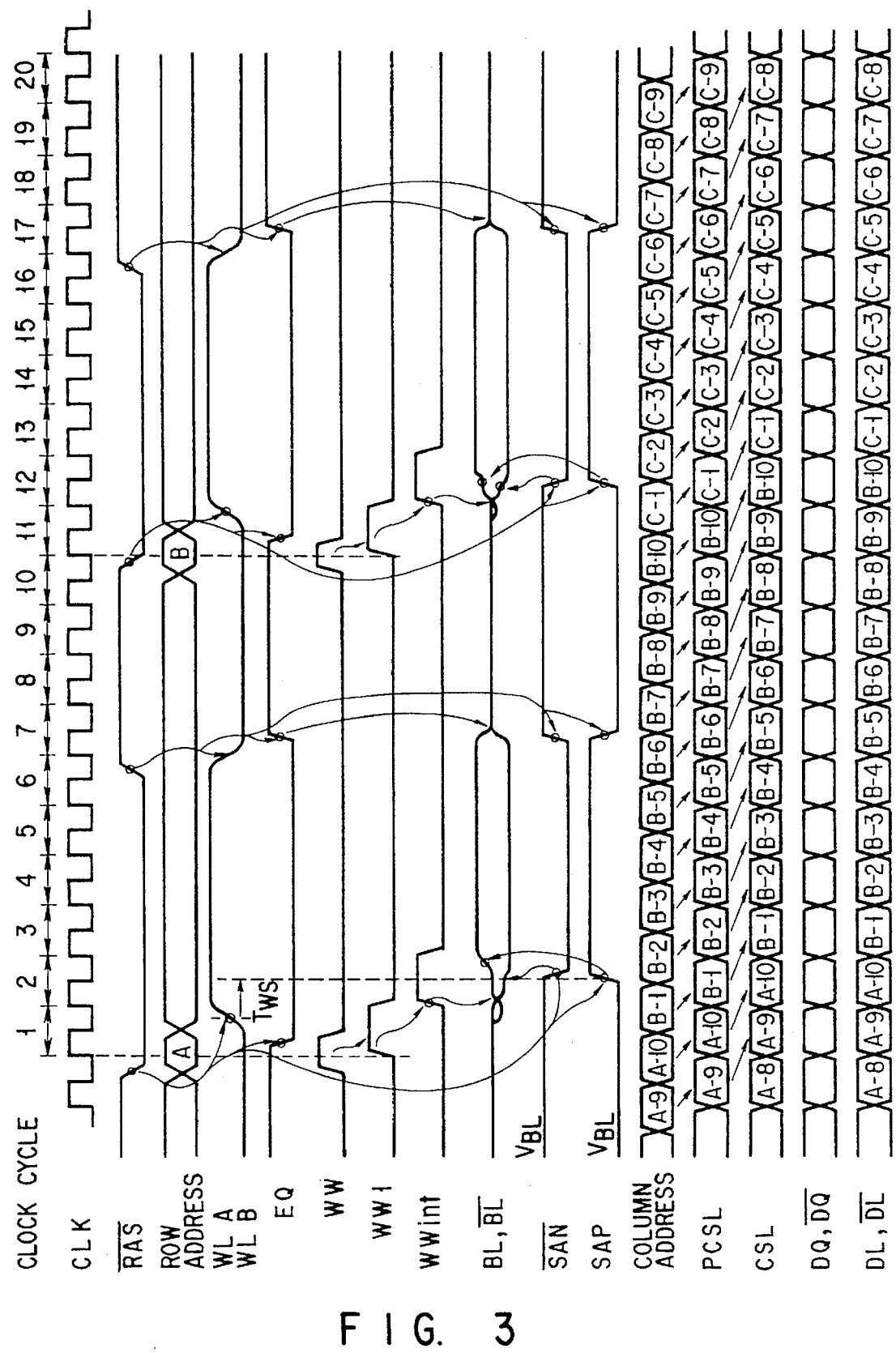
FIG. 3 is a timing chart for illustrating the operation of the circuit shown in FIGS. 1 and 2.

FIG. 3 is a timing chart of the second-stage writing operation in the circuit of FIGS. 1 and 2, that is, the operation of data transfer from the data latch 37 to the sense amplifier 13. In this case, it is supposed that transfer of write data to the data latch 37 is previously completed.

When the $\overline{\text{RAS}}$ signal is set to the "L" level, the row system control circuit 15 is activated and a word line WLA (it is assumed that the word line WLA is selected by the row address signal) corresponding to the input row address signal is set to the "H" level in synchronism with the fall of the $\overline{\text{RAS}}$ signal. Further, the equalizing signal EQ is set to the "L" level in synchronism with the fall of the $\overline{\text{RAS}}$ signal to turn OFF the MOS transistors N9 to N11 and the equalizing operation of the bit lines BL, $\overline{\text{BL}}$ is interrupted. Further, the transfer gate activation sign to the WW set to the "H" level at the beginning of the first clock cycle in FIG. 3 in parallel with the word line selecting operation and the signal WW is fetched into the WW buffer 34 at the leading edge of the clock signal CLK. The thus fetched transfer gate activation signal WW is transferred via the pipeline stages PL1-1, PL1-2 to raise the internal transfer gate activation signal WWint to the "H" level in the second clock cycle after the potential of the word line is set to the "H" level. As a result, the transfer gate 36 is turned ON and data is transferred from the data latch 37 to the paired bit lines BL, $\overline{\text{BL}}$. When the transferred data is different from data read out from the memory cell 11-1 selected by the word line WL, the potentials of the paired bit lines BL, $\overline{\text{BL}}$ are inverted at this time. On the other hand, if the transferred data is equal to the readout data, the potentials of the paired bit lines BL, $\overline{\text{BL}}$ are kept unchanged. After this, a sense amplifier activation signal SAP output from the sense amplifier control circuit 23 is set to the "H" level and $\overline{\text{SAN}}$ is set to the "L" level to activate the sense amplifier 13. As a result, the potential difference between the paired bit lines BL and $\overline{\text{BL}}$ is amplified and data corresponding to the potentials of the paired bit lines BL, $\overline{\text{BL}}$ is written into the memory cell.

When the $\overline{\text{RAS}}$ signal is raised to the "H" level, the potential of the word line WLA is set to the "L" level and the equalizing signal EQ is set to the "H" level so that the MOS transistors Q9 to Q11 are turned ON and the paired bit lines BL, $\overline{\text{BL}}$ are set to a potential $V_{BL}$. Further, the sense amplifier activation signals $\overline{\text{SAN}}$ and SAP are set to the "$V_{BL}$" level.

Next, if the $\overline{\text{RAS}}$ signal is set to the "L" level again, the potential of the word line WLB (it is assumed that the word line WLB is selected by the row address signal) corresponding to the input row address is set to the "H" level in synchronism with the fall of the RAS signal. Further, the equalizing signal EQ is set to the "L" level in synchronism with the fall of the RAS signal and the MOS transistors N9 to N11 are turned OFF so as to interrupt the equalizing operation of the paired bit lines BL, $\overline{\text{BL}}$. The transfer gate activation signal WW is set to the "H" level in parallel with the word line selecting operation, the signal WW is fetched into the WW buffer 34 at the leading edge of the clock signal CLK, and the same writing operation as described before is effected for the selected memory cell.

In the first embodiment, the sense amplifier activation signals (SAP, $\overline{\text{SAN}}$) are respectively set to the "H" and "L" levels after a preset time $T_{WS}$ has elapsed after selection of the word line, but the operation of raising the internal transfer gate activation signal WWint to the "H" level is designed to be effected before the time $T_{WS}$ has elapsed. That is, data transfer to the paired bit lines is effected before the sense amplifier 13 is activated. The operation of thus transferring write data to the bit lines before activation of the sense amplifier is called "Early Write" here.

Therefore, time for writing can be reduced in comparison with a case wherein data is transferred after the sense amplifier 13 is activated.

It is desired to enhance the frequency of the clock signal CLK in order to enhance the data transfer speed in the clock synchronous type DRAM. However, in some cases, the user wants to lower the frequency in order to synchronize the clock signal with the clock frequency of the peripheral devices.

Figure 4:
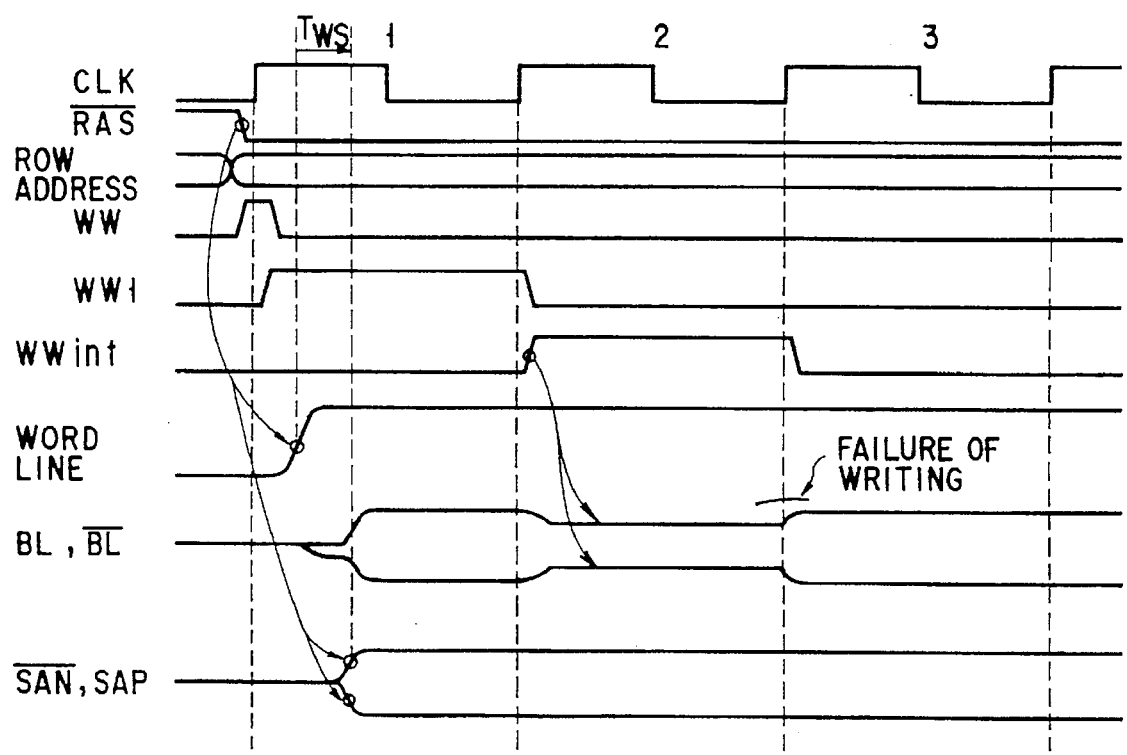
FIG. 4 is a timing chart for illustrating the operation of the circuit shown in FIGS. 1 and 2 in a case where the frequency of a clock signal is lowered.

FIG. 4 is a timing chart of the operation of the circuit shown in FIGS. 1 and 2 effected in a long clock cycle time. As shown in FIG. 4, the sense amplifier activation signals SAP, $\overline{\text{SAN}}$ are respectively changed to the "H" and "L" levels after the passage of time $T_{WS}$ after selection of a word line in the same manner as in the timing of FIG. 3. However, since the clock cycle is long, the internal transfer gate activation signal WWint which is set to the "H" level in response to the rise of the clock signal CLK is set to the "H" level to turn ON the transfer gate section 36 after the potential difference between the paired bit lines caused by activating the sense amplifier 13 by the sense amplifier activation signals SAP, $\overline{\text{SAN}}$ and reading out data from the memory cell is amplified and held. At this time, since the data latch 37 has less current-driving ability less than the sense amplifier 13-1, it cannot invert the output of the sense amplifier 13-1. This gives rise to the possibility that data is not correctly written.

FIG. 5 is a block diagram for illustrating a semiconductor memory device according to a second embodiment of this invention which is attained by improving the semiconductor memory device explained in the first embodiment and in which the defective writing operation can be prevented even when the clock cycle time is made long. In the second embodiment, an Early Write control circuit 39 supplied with a signal WW1 output from the WW buffer 34 and a signal WWint generated from the internal WW buffer 35 is provided in the circuit of FIG. 1 and the Early Write control circuit 39 and the row system control circuit 15 are combined to control a sense amplifier control circuit 23'. With this construction, activation of the sense amplifier 13 at the Early Write time, or the word line selection is effected after data writing.

Figure 6:
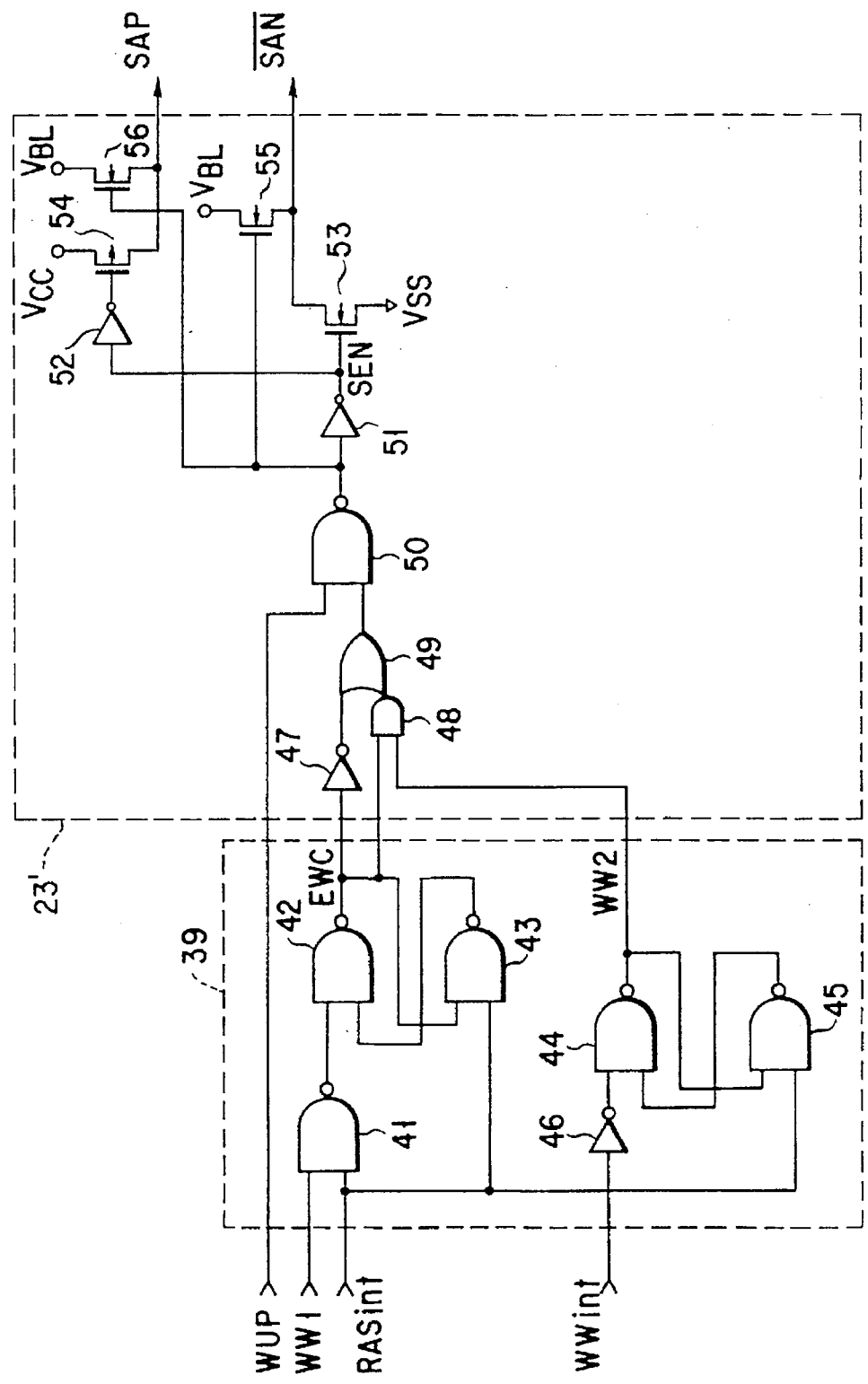
FIG. 6 is a circuit diagram showing an example of the detailed construction of an Early Write control circuit and sense amplifier control circuit shown in FIG. 5.

FIG. 6 shows an example of the construction of the Early Write control circuit 39 and sense amplifier control circuit 23' shown in FIG. 5. The Early Write control circuit 39 includes NAND gates 41 to 45 and an inverter 46. A transfer gate activation signal WW1 output from the WW buffer 34 is supplied to one input terminal of the NAND gate 41 and a RASint signal output from the row system control circuit 15 is supplied to the other input terminal thereof. An output signal of the NAND gate 41 is supplied to one input terminal of the NAND gate 42. An output signal of the NAND gate 43 is supplied to the other input terminal of the NAND gate 42, and an output signal EWC of the NAND gate 42 is supplied to one input terminal of the NAND gate 43. The RASint signal is supplied to the other input terminal of the NAND gate 43. A signal WWint output from the internal WW buffer 35 is supplied to the input terminal of the inverter 46 and an output thereof is supplied to one input terminal of the NAND gate 44. An output of the NAND gate 45 is supplied to the other input terminal of the NAND gate 44 and an output signal WW2 of the NAND gate 44 is supplied to one input terminal of the NAND gate 45. The RASint signal is supplied to the other input terminal of the NAND gate 45.

Further, the sense amplifier control circuit 23' includes inverters 47, 51, 52, AND gate 48, OR gate 49, N-channel MOS transistors 53, 55, 56, P-channel MOS transistor 54 and NAND gate 50. An output signal EWC of the NAND gate 42 is supplied to the input terminal of the inverter 47 and an output thereof is supplied to one input terminal of the OR gate 49. The signal EWC is also supplied to one input terminal of the AND gate 48, a signal WW2 output from the NAND gate 44 is supplied to the other input terminal of the NAND gate 48, and an output thereof is supplied to the other input terminal of the OR gate 49. A timer output signal WUP output from the row system control circuit 15 is supplied to one input terminal of the NAND gate 50 and an output of the OR gate 49 is supplied to the other input terminal thereof. The output signal of the NAND gate 50 is supplied to the input terminal of the inverter 51. A sense amplifier control signal SEN output from the inerter 51 is supplied to the sense amplifier 13 via the N-channel MOS transister 53 as a sense amplifier activation signal $\overline{SAN}$ and supplied to the sense amplifier 13 via the inverter 52 and P-channel MOS transister 54 as a sense amplifier activation signal SAP.

Figure 7:
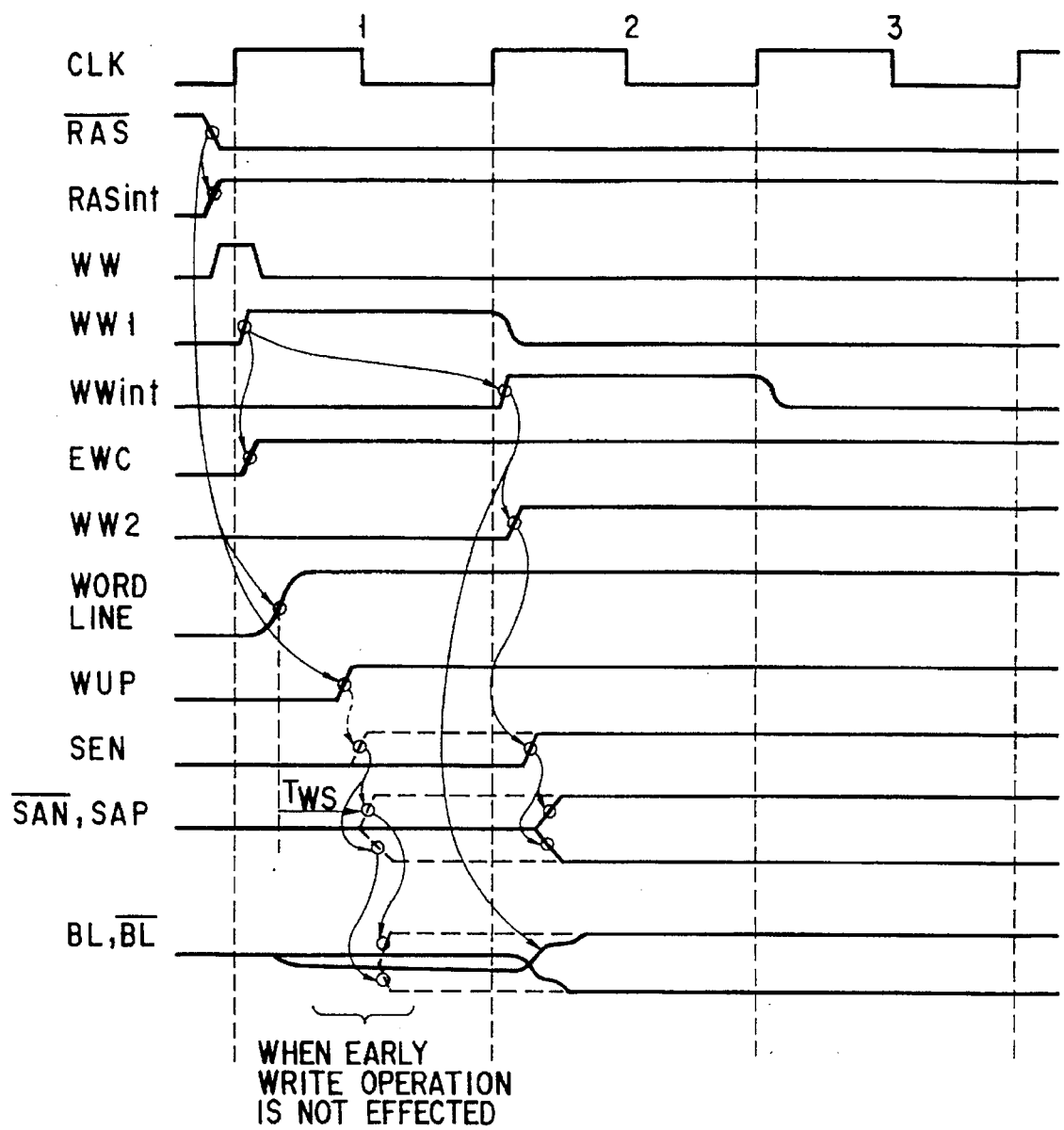
FIG. 7 is a timing chart for illustrating the operation of the circuit shown in FIGS. 5 and 6.

Next, the writing operation in a case wherein the clock cycle time is long in the circuit of FIGS. 5 and 6 is explained with reference to the timing chart of FIG. 7. When the $\overline{RAS}$ signal falls to the "L" level, the row system control circuit 15 is activated, the RASint signal which is an inverted signal of the $\overline{RAS}$ signal is set to the "H" level and the row address signal is fetched into the row address buffer 14 and decoded by the row decoder 12 to select a word line. After a preset time $T_{WS}$ has elapsed after the word line was selected, the timer output signal WUP is raised to the "H" level. The operation so far is effected irrespective of whether the Early Write operation in which data is written before activation of the sense amplifier 13 is effected or not (for example, at the time of refresh operation or the operation of only reading cell data to the sense amplifier 13). A difference between the operation effected when the Early Write operation is effected and the operation effected when the Early Write operation is not effected is explained in detail below.

(a) When the Early Write operation is effected:

If the transfer gate activation signal WW is set to the "H" level at the beginning of the first clock cycle, it is fetched into the WW buffer 34 at the leading edge of the clock signal CLK and the signal WW1 is set to the "H" level. The signal WW1 is input to the Early Write control circuit 39 and a signal EWC indicating that the Early Write operation mode is started is set to the "H" level and the signal WWint is set to the "H" level in the second clock cycle. A signal WW2 output from the Early Write control circuit 39 is raised to the "H" level in response to the change of the signal WWint to the "H" level. As is understood from FIG. 7, when the signal EWC is set at the "H" level and the initial state of the signal WW2 is set at the "L" level, the sense amplifier control signal SEN is not raised to the "H" level even if the timer output signal WUP is set to the "H" level, and the signal SEN is set to the "H" level only after the signal WW2 is set to the "H" level in response to the change of the signal WWint to the "H" level. That is, unlike the first embodiment described before, in the second embodiment, since the sense amplifier 13 is activated after the signal WWint is set to the "H" level at the Early Write operation time and data is written into the bit lines, the writing operation can be effected in a short period of time even when the clock cycle time is long and no defective writing operation will be effected. Further, in a case where the clock cycle time is short and the signal WWint is set to the "H" level before the timer output signal WUP is set to the "H" level, the sense amplifier control signal SEN is raised to the "H" level after the time $T_{WS}$ has elapsed after selection of the word line and the timer output signal WUP is set to the "H" level.

Therefore, with the above construction, there occurs no possibility that the defective writing operation will be effected even if the clock cycle time is made long.

(b) When the Early Write operation is not effected:

A sequence of operations from the fall of the $\overline{RAS}$ signal to selection of the word line and activation of the sense amplifier 13 is effected with the transfer gate activation signal WW fixed at the "L" level. In this case, as shown by broken lines in FIG. 7, the signals SEN, SAP are set to the "H" level and the signal $\overline{SAN}$ is set to the "L" level to activate the sense amplifier 13 immediately after the timer output signal WUP rises. In this case, data writing via the transfer gate 36 is not effected, of course, and the sense amplifier 13 effects the operation of reading out and latching cell data. Further, after latching the cell data, the transfer gate section 36 can be turned ON for a plurality of clock cycles and the operation of writing into the bit lines can be effected for a long period of time. This is not the Early Write operation but is the Delayed Write operation effected in the normal DRAM.

Figure 8:
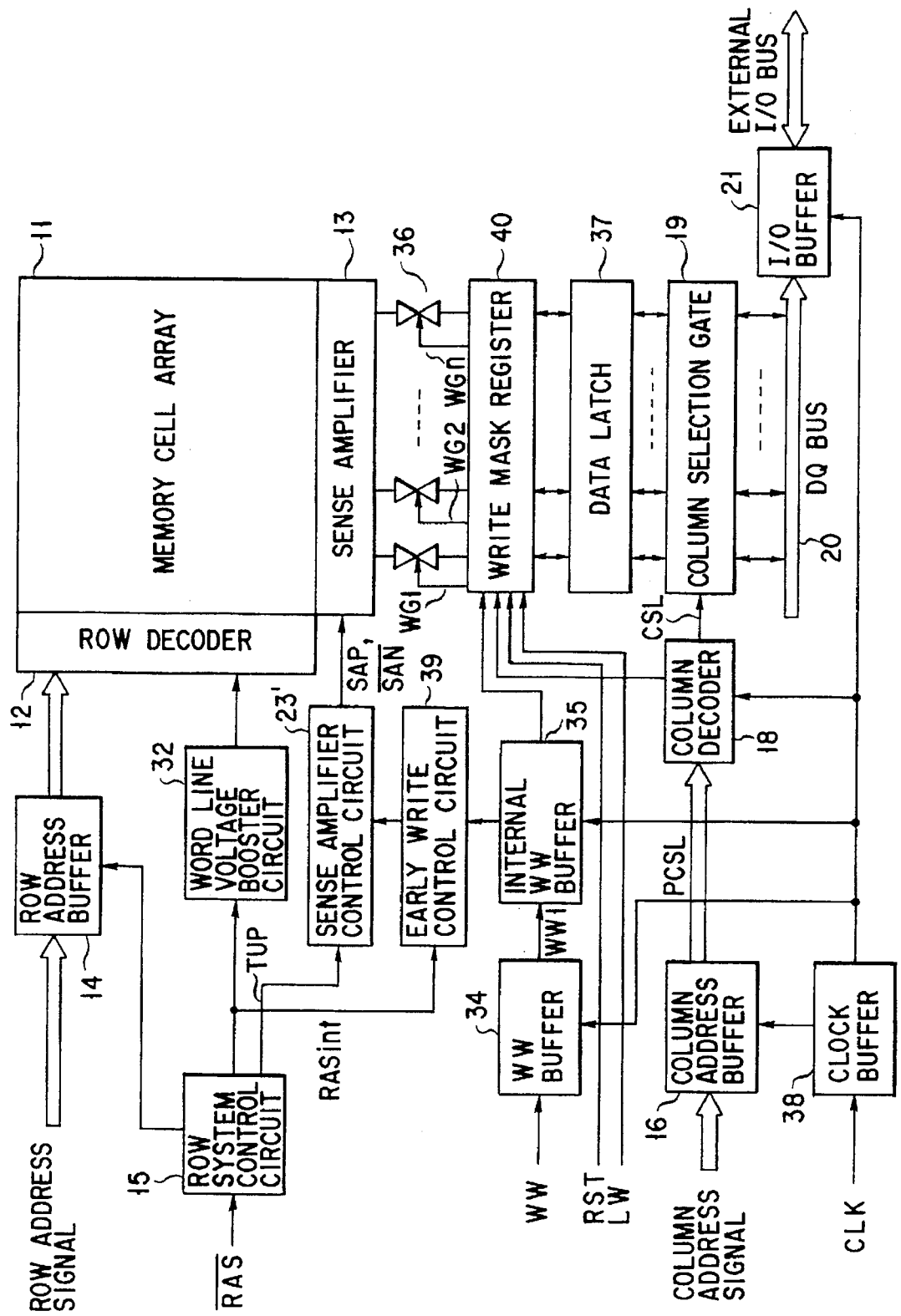
FIG. 8 is a block diagram showing the schematic construction of another clock synchronous type DRAM with data latch which can be operated in a wide clock frequency range, for illustrating a semiconductor memory device according to a third embodiment of this invention.
Figure 9:
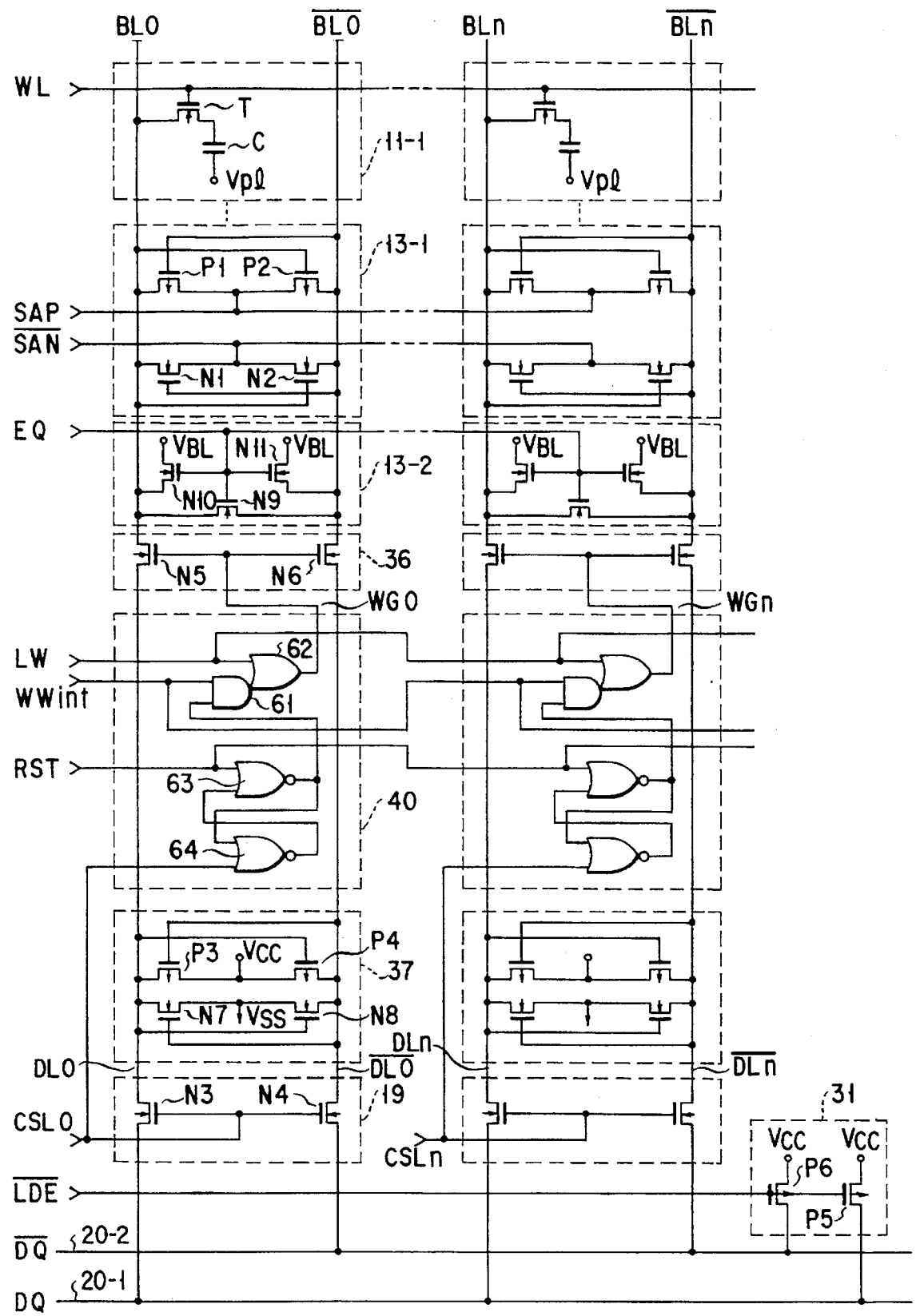
FIG. 9 is a circuit diagram showing the detailed construction of a memory cell, sense amplifier, transfer gate, data latch, write mask register, column selection gate and DQ bus in the circuit of FIG. 8.

FIGS. 8 and 9 are diagrams for illustrating a semiconductor memory device according to a third embodiment of this invention, FIG. 8 is a block diagram showing the schematic construction of the memory device and FIG. 9 is a circuit diagram showing an example of the construction of a memory cell, sense amplifier 13, transfer gate section 36, write mask register 40, data latch 37, column selection gate 19 and DQ bus 20 in FIG. 8. The circuit of FIG. 8 is convenient in a case wherein the write mask register 40 is provided between the transfer gate section 36 and the data latch 37 and the refresh operation is effected by turning ON the transfer gate 36 only on the column in which a write enable flag WF is set at the "H" level and reading out and latching cell data by the sense amplifier 13 without turning ON the transfer gate 36 on the column in which the write enable flag WF is set at the "L" level.

In the circuit shown in FIG. 9, the constructions of the memory cell 11-1, sense amplifier 13, transfer gate section 36, data latch 37, column selection gate 19, DQ buffer 20 and precharge circuit 31 are substantially the same as those of the circuit shown in FIG. 2. The write mask register 40 includes an AND gate 61, OR gate 62, and NOR gates 63, 64. One input terminal of the AND gate 61 is supplied with a signal WWint, the other input terminal thereof is supplied with an output signal of the NOR gate 63, and an output thereof is supplied to one input terminal of the 0R gate 62. The other input terminal of the OR gate 62 is supplied with a signal LW, and the ON/OFF states of MOS transistors N5, N6 constructing the transfer gate 36 are controlled by an output WG0 of the OR gate 62. One input terminal of the NOR gate 63 is supplied with a reset signal RST, the other input terminal thereof is supplied with an output of the NOR gate 64, and an output thereof is supplied to one input terminal of the NOR gate 64. The other input terminal of the NOR gate 64 is supplied with a column selection signal CSL0.

Next, the third embodiment is explained in detail. In this example, as shown in FIG. 9, the write mask register 40 is provided for each column and the write enable flag WF of the write mask register 40 is set to the "H" level for a column in which the column selection gate 19 is set ON (that is, CSLi="H" level, i=0 to n) to write data into the data latch 37 via the DQ bus 20. The signal RST is used to reset the write mask register 40, and is set at the "H" level when the register 40 is reset and set at the "L" level at the other time. The signal LW is a signal for forcedly turning ON all of the transfer gates 36 without using the write mask register 40, and in this example, it is considered that it is fixed at the "L" level. First, the write mask register 40 is reset by use of the signal RST, then the column selection signals CSLi (i=0 to n) are sequentially selected, and data is written into the data latch 37 via the DQ bus 20 only in m (m<n) columns out of the n columns. Next, since the flags WF only in the m columns into which data is previously written into the data latch 37 are set at the "H" level and the signal WG is also set to the "H" level, the transfer gates 36 are turned ON when the signal WWint is raised to the "H" level. Therefore, data is written via the transfer gates 36 only in the m columns and the operation of simply refreshing the memory cell data by the sense amplifier 13 is effected in the remaining (n–m) columns. In this case, in order to attain the stable operation, it is necessary to activate the sense amplifier 13 after the passage of a period of time $T_{WS}$ from the time when the word line is selected and cell data is read out to the paired bit lines BL, $\overline{BL}$ to the time when a sufficiently large potential difference appears between the paired bit lines BL and $\overline{BL}$ in the column in which the refresh operation is effected. Therefore, in the third embodiment, if the signal WWint is set to the "H" level before the timer output signal WUP is set to the "H" level, it is preferable to effect the control by setting the signal SEN to the "H" level after the time $T_{WS}$ has elapsed after selection of the word line and the timer output signal WUP has been set to the "H" level.

Next, a semiconductor memory device according to a fourth embodiment is explained by use of FIGS. 10 to 12. FIG. 10 is a block diagram showing the schematic construction, and FIG. 11 shows an example of the detailed construction of an Early Write control circuit 39 shown in FIG. 10. Further, FIG. 12 is a timing chart of a case wherein the clock cycle time is set long.

As shown in FIG. 10, the Early Write control circuit 39 is supplied with a $\overline{RAS}$ signal, a signal WW1 output from a WW buffer 34 and a signal WWint output from an internal WW buffer 35 and outputs a signal WON. The logical AND of the signal WON and an output signal XVLD of a row system control circuit 15 is derived by an AND gate 65 and a word line voltage raising circuit 32 and sense amplifier control circuit 23 are controlled by an output of the AND gate 65.

As shown in FIG. 11, the Early Write control circuit 39 is constructed by two circuit sections 39-1, 39-2. The first circuit section 39-1 includes inverters 66, 67 and NAND gates 69 to 72, and the second circuit section 39-2 includes an inverter 73, AND gate 74 and OR gate 75. One input terminal of the NAND gate 68 is supplied with an output signal WW1 of the WW buffer 34, the other input terminal thereof is supplied with a $\overline{RAS}$ signal via the inverter 66, and an output thereof is supplied to one input terminal of the NAND gate 69. The other input terminal of the NAND gate 69 is supplied with an output signal of the NAND gate 70 and an output signal EWC thereof is supplied to one input terminal of the NAND gate 70, the input terminal of the inverter 73 and one input terminal of the AND gate 74. The other input terminal of the NAND gate 70 is supplied with an output signal of the inverter 66. Further, the output signal WWint of the internal WW buffer 35 is supplied to the input terminal of the inverter 67 and an output of the inverter is supplied to one input terminal of the NAND gate 71. The other input terminal of the NAND gate 71 is supplied with an output signal of the NAND gate 72 and an output signal WW2 thereof is supplied to one input terminal of the NAND gate 72 and the other input terminal of the AND gate 74. The other input terminal of the NAND gate 72 is supplied with an output signal of the inverter 66. An output signal of the inverter 73 and an output signal of the AND gate 74 are supplied to the OR gate 75 and a signal WON is output from the OR gate 75.

A difference between the fourth embodiment and the second and third embodiments is that the control operation is effected to gate a signal path from the row system control circuit 15 to the word line activation control circuit (word line voltage booster circuit 32 in FIG. 10) and sense amplifier control circuit 23 by use of the output signal WON of the Early Write control circuit 39 and keep not only the sense amplifier 13 but also the word line in the non-activated state until the data writing is effected at the time of Early Write operation.

The operation is explained in detail with reference to FIG. 12. When the $\overline{RAS}$ signal falls, the row system control circuit 15 is activated and the signal XVLD is raised to the "H" level. At this time, the operation is effected as follows according to whether the Early Write operation is effected or not.

(a) When the Early Write operation is effected:

The transfer gate activation signal WW is set to the "H" level at the beginning of the first clock cycle and fetched into the WW buffer 34 at the leading edge of the clock signal CLK. The thus fetched signal WW is transferred along the pipeline stage, and the signal WW1 and signal WWint are set to the "H" level. When the signal WW1 is raised to the "H" level, the control signal EWC (corresponding to a first control signal) is set to the "H" level and the signal WON is set to the "L" level so that the signal path from the row system control circuit 15 to the word line voltage control circuit 32 and sense amplifier control circuit 23 may be interrupted by the AND gate 65. Next, if the signal WWint is set to the "H" level, transfer of write data to the bit lines is effected, and at the same time, the signal WW2 is raised to the "H" level. As a result, the signal WON is raised to the "H" level and the potential of the selected word line is set to the "H" level. Further, the sense amplifier 13 is activated after the time $T_{WS}$ has elapsed after the word line potential was raised to the "H" level. Therefore, also in this embodiment, since the sense amplifier 13 is activated after write data is transferred to the bit lines, the writing operation can be effected in a short period of time and no defective writing operation will be effected.

(b) When the Early Write operation is not effected:

In this case, as indicated by broken lines in FIG. 12, the signals WW, WW1, WW2, and WWint are fixed at the "L" level. At this time, the signal WON is fixed at the "H" level, and when the $\overline{RAS}$ signal is lowered to the "L" level and the row system control circuit 15 is activated, the word line can be selected without being limited by the signal WON. Then, after the time TWS has elapsed after the selected word line was raised to the "H" level, the sense amplifier 13 is activated and cell data is amplified and latched.

Therefore, like the second and third embodiments, with the construction of the fourth embodiment, there is no possibility that the defective writing operation will be effected even when the clock cycle time is made long.

This invention is not limited to the first to fourth embodiments and can be variously modified without departing from the technical scope thereof.

As described above, according to this invention, a clock synchronous type DRAM with data latch in which the operation margin can be enlarged can be attained. Further, a clock synchronous type DRAM with data latch in which the timing of data transfer between the sense amplifier and the data latch can be adequately determined by use of a clock signal of wide frequency range can be attained.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device comprising:
   a memory cell array having a plurality of dynamic memory cells arranged in an array of rows and columns;
   word lines each connected to those of said memory cells which are arranged on a corresponding one of the rows of said memory cell array;
   row decoder means for selecting a desired row in said memory cell array be selectively driving one of said word lines;
   bit line pairs each connected to those of said memory cells which are arranged on a corresponding one of the columns of said memory cell array;
   column decoder means for designating a column in said memory cell array in synchronism with a clock signal;
   sense amplifier means for amplifying data read out from said memory cell and data to be written into said memory cell;
   sense amplifier control means for controlling the operation of said sense amplifier means;
   data holding means for holding readout data of one row of said memory cells output from said sense amplifier means and write data of one row of said memory cells supplied to said sense amplifier means;
   transfer means for effecting the data transfer from said sense amplifier means to said data holding means and the data transfer from said data holding means to said sense amplifier means;
   transfer control means for controlling said transfer means;
   column selection means controlled by said column decoder means so as to select columns designated by said column decoder means from said memory cell array; and
   early write control means for controlling said sense amplifier control means to activate said sense amplifier means in order to amplify a potential difference between a bit line pair of the selected column of said memory cell array after one of said word lines is selected by said row decoder means at a time of data writing, wherein data is held by supplying data to be written to said data holding means through the column selection means on a column designated by said column decoder means, and wherein said transfer control means controls said transfer means to transfer the data supplied from said data holding means to the bit line pair of the selected column of said memory cell array.

2. A semiconductor memory device according to claim 1, wherein said row decoder means includes a row address buffer supplied with a row address signal and a row decoder supplied with an output signal of said row address buffer, for selecting the word line.

3. A semiconductor memory device according to claim 1, further comprising a word line voltage booster circuit for supplying a voltage boosting potential for boosting the potential of said word lines to said row decoder, and a row system control circuit for controlling said row address buffer, word line voltage boosting circuit and sense amplifier control means in response to a row address strobe signal.

4. A semiconductor memory device according to claim 1, wherein said sense amplifier means includes a first circuit for amplifying data read out on the bit line pair from the memory cell positively feeding the data back to the bit line pair to hold the data, and a second circuit for equalizing the potentials of the paired bit lines in response to an equalizing signal.

5. A semiconductor memory device according to claims 1, wherein said transfer means includes a pair of transistors whose current paths are connected at one end to the bit line pair and connected at the other end to a data line pair and whose ON/OFF states are controlled by an output signal of said transfer control means for each column of said memory cell array.

6. A semiconductor memory device according to claim 1, wherein said transfer control means controls said transfer means in response to a transfer gate activation signal.

7. A semiconductor memory device according to claim 1, wherein said transfer control means includes a first buffer supplied with a transfer gate activation signal and operated in synchronism with a clock signal, and a second buffer supplied with an output signal of said first buffer, for controlling said transfer means in synchronism with the clock signal.

8. A semiconductor memory device according to claim 1, wherein said transfer control means includes a first buffer supplied with a transfer gate activation signal and operated in synchronism with a clock signal, and a second buffer supplied with an output signal of said first buffer, for controlling said transfer means in synchronism with the clock signal, said column decoder means includes a column address buffer supplied with column address signal and operated in synchronism with the clock signal, and a column decoder supplied with an output signal of said column address buffer and operated in synchronism with the clock signal, a signal transmission path from said first buffer to said second buffer and a signal transmission path from said column address buffer to said column decoder permit a signal to propagate in one clock cycle of the clock signal, and a signal transmission path from said second buffer to said transfer means and a signal transmission path from said column decoder to said column selection means permit a signal to propagate in one clock cycle of the clock signal.

9. A semiconductor memory device according to claim 1, further comprising an I/O buffer for temporarily storing data read out from the memory cell and data to be written into the memory cell, and a bus provided between said I/O buffer and said column selection means.

10. A semiconductor memory device according to claim 1, which further comprises a row system control circuit for controlling said sense amplifier means and a circuit of row system in response to a row address strobe signal, and in which said transfer control means includes a first buffer supplied with a transfer gate activation signal and operated in synchronism with a clock signal, and a second buffer supplied with an output signal of said first buffer, for controlling said transfer means in synchronism with the clock signal, wherein said Early Write control means is supplied with a signal output from said row system control circuit, a signal output from said buffer and a signal output from said second buffer to control said sense amplifier control means.

11. A semiconductor memory device according to claim 1, which further comprises a row system control circuit for controlling a circuit of row system in response to a row address strobe signal, and a write mask register for masking transfer data from said data holding means to said sense amplifier means, and in which said transfer control means includes a first buffer supplied with a transfer gate activation signal and operated in synchronism with a clock signal, and a second buffer supplied with an output signal of said first buffer, for controlling said transfer means in synchronism with the clock signal, wherein Early Write control means is supplied with a signal from said second buffer, said Early Write control means and said row system control circuit control said sense amplifier control means, and said write mask register is controlled by an output signal of said second buffer, reset signal, a signal for forcedly turning ON said transfer means on all of the columns, and an output signal of said column decoder means.

12. A semiconductor memory device according to claim 1, which further comprises a row system control circuit for controlling a circuit of row system in response to a row address strobe signal, and logic means for controlling said sense amplifier control means by a logical AND signal between an output signal of said row system control circuit and an output signal of Early Write control means, said Early Write control means operating in response to the row address store signal, and in which said transfer control means includes a first buffer supplied with a transfer gate activation signal and operated in synchronism with a clock signal, and a second buffer supplied with an output signal of said first buffer, for controlling said transfer means in synchronism with the clock signal, and an output signal of said first buffer and an output signal of said second buffer are supplied to said Early Write control means.

13. A semiconductor memory device comprising:

a memory cell array having a plurality of dynamic memory cells arranged in an array of rows and columns;

word lines each connected to those of said memory cells which are arranged on a corresponding one of the rows of said memory cell array;

a row decoder for selecting one of rows of said memory cell array by selectively driving said word lines;

a row address buffer supplied with a row address signal and supplies the row address signal to said row decoder;

bit line pairs each connected to those of said memory cells which are arranged on a corresponding one of the columns of said memory cell array;

a column decoder for designating a column of said memory cell array in synchronism with a clock signal;

a column address buffer supplied with a column address signal and for supplying the column address signal to said column decoder in synchronism with the clock signal;

sense amplifiers respectively connected to said bit line pairs, for amplifying data read out from said memory cells and data to be written into said memory cells;

a sense amplifier control circuit for controlling the operation of said sense amplifiers;

a row system control circuit operated in response to a row address strobe signal to control the operations of said row address buffer and said sense amplifier control circuit;

a data latch for holding readout data output from said sense amplifier and write data supplied to said sense amplifier for each bit line pair;

transfer gates for effecting data transfer from said sense amplifier to said data latch and data transfer from said data latch to said sense amplifier;

a first buffer supplied with a transfer gate activation signal and operated in synchronism with the clock signal;

a second buffer supplied with an output signal of said first buffer and controlling said transfer gate in synchronism with the clock signal;

Early Write control circuit supplied with an output signal from said row system control circuit, an output signal from said first buffer, and an output signal from said second buffer, said Early Write control circuit controlling said sense amplifier control circuit; and a column selection gate for selecting a bit line pair on a column designated by said column decoder.

14. A semiconductor memory device according to claim 13, further comprising a word line voltage booster circuit controlled by an output signal of said row system control circuit and supplying a voltage boosting potential for boosting the potential of said word lines to said row decoder.

15. A semiconductor memory device according to claim 13, further comprising a bus connected to said column selection gate and an I/O buffer connected to said bus.

16. A semiconductor memory device according to claim 15, further comprising a clock buffer for supplying the clock signal to said column address buffer, said first buffer, said second buffer, said column decoder, and said I/O buffer.

17. A semiconductor memory device according to claim 13, wherein said Early Write control circuit controls said sense amplifier control circuit to activate said sense amplifier in order to amplify a potential difference between a bit line pair of the selected column of said memory cell array after one of said word lines is selected by said row decoder at a time of data writing, data is held by supplying data to be written to said data latch through the column selection gate on a column designated by said column decoder, and said second buffer controls said transfer gate to transfer the data supplied from said data latch to the bit line pair of the selected column of said memory cell array.

18. A semiconductor memory device comprising:

a memory cell array having a plurality of dynamic memory cell arranged in an array of rows and columns;

word lines each connected to those of said memory cells which are arranged on a corresponding one of the rows of said memory cell array;

a row decoder for selecting one of rows of said memory cell array by selectively driving said word lines;

a row address buffer supplied with a row address signal and supplies the row address signal to said row decoder;

a word line voltage booster circuit for supplying a voltage boosting potential for boosting the potential of said word lines to said row decoder;

bit line pairs each connected to those of said memory cells which are arranged on a corresponding one of the columns of said memory cell array;

a column decoder for designating a column or said memory cell array in synchronism with a clock signal;

a column address buffer supplied with a column address signal and for supplying the column address signal to said column decoder in synchronism with the clock signal;

sense amplifiers respectively connected to said bit line pairs, for amplifying data read out from said memory cells and data to be written into said memory cells;

a sense amplifier control circuit for controlling the operation of said sense amplifiers;

a row system control circuit operated in response to a row address strobe signal to control the operations of said row address buffer and said sense amplifier control circuit;

a data latch for holding readout data output from said sense amplifier and write data supplied to said sense amplifier for each bit line pair;

transfer gates for effecting data transfer from said sense amplifier to said data latch and data transfer from said data latch and data transfer from said data latch to said sense amplifier;

a first buffer supplied with a transfer gate activation signal and operated in synchronism with the clock signal; and a second buffer supplied with an output signal of said first buffer and controlling said transfer gate in synchronism with the clock signal; and an Early Write control circuit supplied with an output signal from said first buffer, an output signal from said second buffer, and said row address strobe signal;

a logic circuit for ANDING an output signal from said row system control circuit and an output signal from said Early Write control circuit, and for supplying the AND to said sense amplifier control circuit and said word line voltage booster circuit; and a column selection gate for selecting a bit line pair on a column designated by said column decoder.

19. A semiconductor memory device according to claim 18, further comprising a bus connected to said column selection gate, and I/O buffer connected to said bus.

20. A semiconductor memory device according to claims 19, further comprising a clock buffer for supplying the clock signal to said column address buffer, said first buffer, said second buffer, said column decoder, and said I/O buffer.

21. A semiconductor memory device according to claim 18, wherein said Early Write control circuit controls said word line voltage booster circuit to activate said word line in order to amplify a potential difference between a bit line pair of the selected column of, said memory cell array after one of said word lines is selected by said row decoder at a time of data writing, and wherein data is held by supplying data to be written to said data latch through the column selection gate on a column designated by said column decoder, and said second buffer controls said transfer gate to transfer the data supplied from said data latch to the bit line pair of the selected column of said memory cell array.

* * * * *